US009576873B2

(12) United States Patent
Do et al.

(10) Patent No.: US 9,576,873 B2

(45) Date of Patent: Feb. 21, 2017

(54) INTEGRATED CIRCUIT PACKAGING SYSTEM WITH ROUTABLE TRACE AND METHOD OF MANUFACTURE THEREOF

(75) Inventors: Byung Tai Do, Singapore (SG); Arnel Senosa Trasporto, Singapore (SG); Linda Pei Ee Chua, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 797 days.

(21) Appl. No.: 13/325,881

(22) Filed: Dec. 14, 2011

(65) Prior Publication Data

US 2013/0154105 A1 Jun. 20, 2013

(51) Int. Cl.

*H01L 23/31* (2006.01)
*H01L 21/56* (2006.01)
*H01L 23/495* (2006.01)
*H01L 21/48* (2006.01)
*H01L 25/10* (2006.01)
*H01L 23/00* (2006.01)

(52) U.S. Cl.

CPC ....... *H01L 23/3128* (2013.01); *H01L 21/4832* (2013.01); *H01L 21/563* (2013.01); *H01L 21/565* (2013.01); *H01L 23/49517* (2013.01); *H01L 23/49548* (2013.01); *H01L 23/49582* (2013.01); *H01L 25/105* (2013.01); *H01L 24/48* (2013.01); *H01L 24/73* (2013.01); *H01L 2224/16145* (2013.01); *H01L 2224/32145* (2013.01); *H01L 2224/32245* (2013.01); *H01L 2224/48145* (2013.01); *H01L 2224/48247* (2013.01); *H01L 2224/73265* (2013.01); *H01L 2225/1029* (2013.01); *H01L 2225/1058* (2013.01); *H01L 2924/10253* (2013.01); *H01L 2924/12042* (2013.01); *H01L 2924/15321* (2013.01)

(58) Field of Classification Search

CPC .............................................. H01L 2224/73265
USPC .................. 438/106–123; 257/676, E23.031, 257/E21.505

See application file for complete search history.

(56) References Cited

U.S. PATENT DOCUMENTS

| | | | | |
|---|---|---|---|---|
| 5,844,321 | A * | 12/1998 | Baudet | 257/779 |
| 5,943,558 | A * | 8/1999 | Kim et al. | 438/125 |
| 6,150,615 | A * | 11/2000 | Suzuki | 174/260 |
| 6,509,643 | B2 * | 1/2003 | Ohtaka et al. | 257/712 |
| 6,559,528 | B2 * | 5/2003 | Watase et al. | 257/684 |
| 6,797,142 | B2 * | 9/2004 | Crosby | 205/145 |
| 7,361,533 | B1 | 4/2008 | Huemoeller et al. | |
| 7,777,351 | B1 | 8/2010 | Berry et al. | |
| 7,795,743 | B2 * | 9/2010 | Kim et al. | 257/786 |

(Continued)

OTHER PUBLICATIONS

U.S. Appl. No. 12/964,617, filed Dec. 9, 2010, Choi et al.
U.S. Appl. No. 13/102,041, filed May 5, 2011, Do et al.

*Primary Examiner* — Mohammad Islam
*Assistant Examiner* — Ankush Singal
(74) *Attorney, Agent, or Firm* — Wong & Rees LLP

(57) ABSTRACT

A method of manufacture of an integrated circuit packaging system includes: providing routable traces including a first routable trace with a top plate and a second routable trace; mounting an integrated circuit partially over a second routable trace; forming an encapsulation over and around the first routable trace and the integrated circuit; forming a hole through the encapsulation to the top plate; and forming a protective coat directly on the encapsulation with the first routable trace between and in contact with the protective coat and the encapsulation.

20 Claims, 6 Drawing Sheets

1300 1302 132 130 1304 144 110 120 128 108 102

(56) References Cited

U.S. PATENT DOCUMENTS

| | | | | |
|---|---|---|---|---|
| 7,936,061 | B2 * | 5/2011 | Machida | 257/698 |
| 8,053,275 | B2 * | 11/2011 | Hasegawa | 438/106 |
| 8,796,561 | B1 * | 8/2014 | Scanlan | 174/260 |
| 2003/0194834 | A1 * | 10/2003 | Watase et al. | 438/109 |
| 2004/0160752 | A1 * | 8/2004 | Yamashita et al. | 361/766 |
| 2004/0208329 | A1 * | 10/2004 | Kitagawa | 381/175 |
| 2005/0161755 | A1 * | 7/2005 | Huang et al. | 257/433 |
| 2005/0205978 | A1 * | 9/2005 | Pu et al. | 257/678 |
| 2007/0158857 | A1 * | 7/2007 | Mihara | 257/780 |
| 2007/0290376 | A1 * | 12/2007 | Zhao | H01L 21/56 257/787 |
| 2008/0237834 | A1 * | 10/2008 | Hu et al. | 257/693 |
| 2008/0308951 | A1 * | 12/2008 | Li et al. | 257/778 |
| 2009/0115040 | A1 * | 5/2009 | Camacho et al. | 257/677 |
| 2009/0152715 | A1 * | 6/2009 | Shim | H01L 21/568 257/737 |
| 2009/0194854 | A1 * | 8/2009 | Tan et al. | 257/666 |
| 2009/0309231 | A1 * | 12/2009 | Machida | 257/773 |
| 2010/0025830 | A1 * | 2/2010 | Camacho et al. | 257/677 |
| 2010/0043553 | A1 * | 2/2010 | Ichikawa | 73/514.33 |
| 2010/0101836 | A1 * | 4/2010 | Sekimoto | 174/251 |
| 2010/0213605 | A1 * | 8/2010 | Shimizu | 257/700 |
| 2011/0024899 | A1 * | 2/2011 | Masumoto et al. | 257/737 |
| 2011/0042798 | A1 | 2/2011 | Pagaila et al. | |
| 2011/0057298 | A1 * | 3/2011 | Ramos et al. | 257/667 |
| 2011/0140261 | A1 * | 6/2011 | Camacho et al. | 257/690 |
| 2011/0201155 | A1 * | 8/2011 | Kuroda et al. | 438/113 |
| 2011/0201159 | A1 * | 8/2011 | Mori et al. | 438/123 |
| 2011/0260334 | A1 * | 10/2011 | Hasegawa | 257/774 |
| 2011/0291251 | A1 * | 12/2011 | Camacho et al. | 257/676 |
| 2012/0280377 | A1 * | 11/2012 | Do et al. | 257/676 |
| 2012/0299196 | A1 * | 11/2012 | Camacho et al. | 257/775 |
| 2012/0319284 | A1 * | 12/2012 | Ko et al. | 257/773 |
| 2012/0326285 | A1 * | 12/2012 | Espiritu et al. | 257/676 |
| 2012/0326286 | A1 * | 12/2012 | Camacho | 257/676 |

* cited by examiner

INTEGRATED CIRCUIT PACKAGING SYSTEM WITH ROUTABLE TRACE AND METHOD OF MANUFACTURE THEREOF

TECHNICAL FIELD

The present invention relates generally to an integrated circuit packaging system, and more particularly to a system for an integrated circuit packaging system with a routable trace.

BACKGROUND ART

Modern electronics, such as smart phones, personal digital assistants, location based services devices, enterprise class servers, or enterprise class storage arrays, are packing more integrated circuits into an ever-shrinking physical space with expectations for decreasing cost. Numerous technologies have been developed to meet these requirements. Some of the research and development strategies focus on new technologies while others focus on improving the existing and mature technologies. Research and development in the existing technologies can take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. The demand still continues for lower cost, smaller size and more functionality.

Thus, a need still remains for an integrated circuit packaging system including lower cost, smaller size, and more functionality. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing routable traces including a first routable trace with a top plate and a second routable trace; mounting an integrated circuit partially over a second routable trace; forming an encapsulation over and around the first routable trace and the integrated circuit; forming a hole through the encapsulation to the top plate; and forming a protective coat directly on the encapsulation with the first routable trace between and in contact with the protective coat and the encapsulation.

The present invention provides an integrated circuit packaging system, including: routable traces including a first routable trace with a top plate and a second routable trace; an integrated circuit partially over the second routable trace; an encapsulation over and around the first routable trace and the integrated circuit, the encapsulation having a hole through the encapsulation to the top plate; and a protective coat directly on the encapsulation with the first routable trace between and in contact with the protective coat and the encapsulation.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
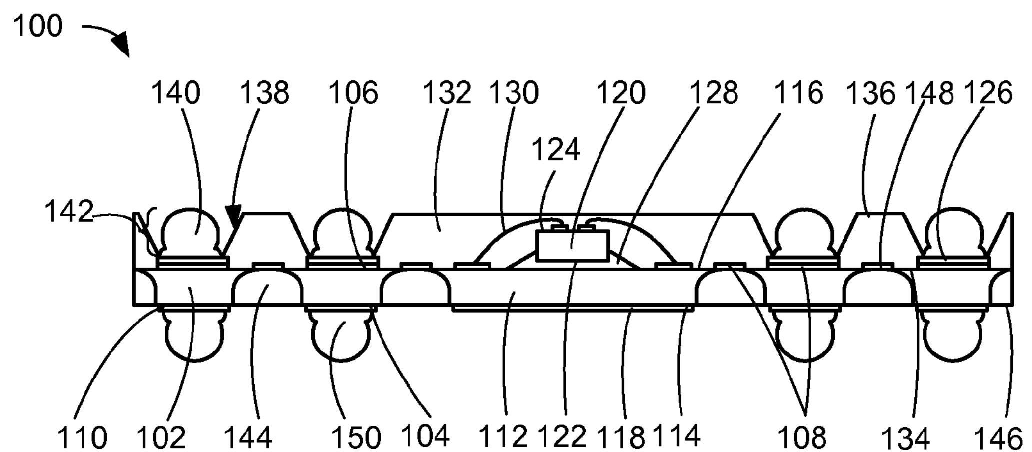
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term “horizontal” as used herein is defined as a plane parallel to the plane of an active surface of the integrated circuit, regardless of its orientation. The term “vertical” refers to a direction perpendicular to the horizontal as just defined. Terms, such as “above”, “below”, “bottom”, “top”, “side” (as in “sidewall”), “higher”, “lower”, “upper”, “over”, and “under”, are defined with respect to the horizontal plane, as shown in the figures.

The term “on” means that there is direct contact between elements. The term “directly on” means that there is direct contact between one element and another element without an intervening element.

The term “active side” refers to a side of a die, a module, a package, or an electronic structure having active circuitry fabricated thereon or having elements for connection to the active circuitry within the die, the module, the package, or the electronic structure. The term “processing” as used herein includes deposition of material or photoresist, patterning, exposure, development, etching, cleaning, and/or removal of the material or photoresist as required in forming a described structure.

Figure 2:
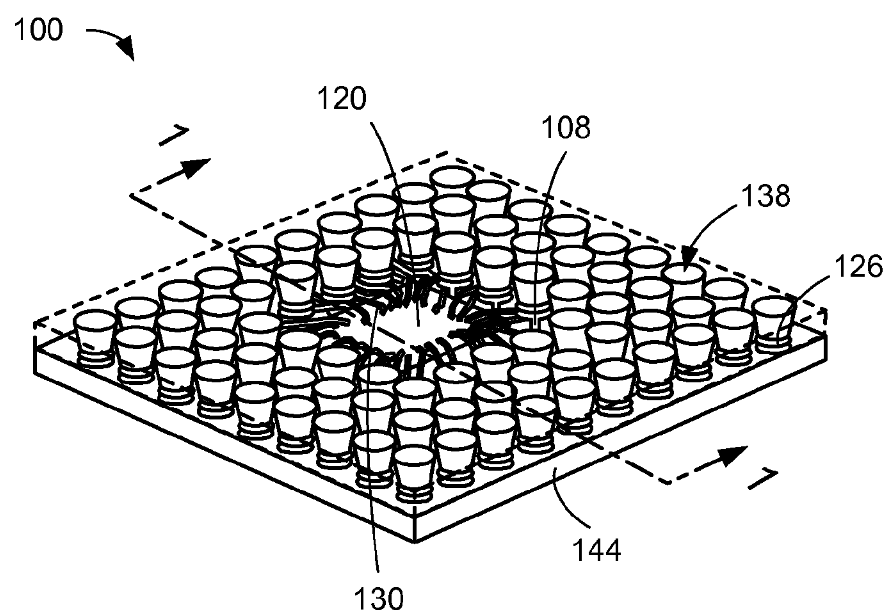
FIG. 2 is an isometric view of the integrated circuit packaging system with the encapsulation of FIG. 1 depicted in dotted lines.

Referring now to FIG. 1, therein is shown a cross-sectional view of an integrated circuit packaging system 100 taken along line 1-1 of FIG. 2 in a first embodiment of the present invention. The integrated circuit packaging system 100 can include a quad flat no-lead (QFN) array.

The integrated circuit packaging system 100 can include a lead 102, which is defined as a structure that provides connectivity for electrical signals or electrical potential levels between the integrated circuit packaging system 100 and an external system (not shown). The integrated circuit packaging system 100 can include the lead 102. The integrated circuit packaging system 100 can also include multiple instances of the lead 102. For example, the lead 102 can represent an interconnection to or from a terminal or a pad of the integrated circuit packaging system 100.

The lead 102 can include a bottom lead side 104 and a top lead side 106 opposite the bottom lead side 104. The lead 102 can include a non-horizontal side having a curvature extending between the bottom lead side 104 and the top lead side 106.

The integrated circuit packaging system 100 can include a routable trace 108, which is defined as a conductive structure for providing electrical signal and power redistribution. The routable trace 108 can be attached to the lead 102. The routable trace 108 can be, for example, a metal layer deposited on the lead 102. The integrated circuit packaging system 100 can include multiple instances of the routable trace 108.

The lead 102 can be attached to an external plate 110. The external plate 110 is defined as a conductive structure to provide electrical connection directly to the routable trace 108. The external plate 110 can provide electrical connection directly to the routable trace 108 through the lead 102. The external plate 110 can be formed at the bottom lead side 104.

The external plate 110 can be formed with a bottom plating process on the bottom lead side 104. Also for example, the bottom lead side 104 can be bare copper (Cu) or other lead metal depending on the application.

For illustrative purposes, the lead 102 is shown as between the external plate 110 and the routable trace 108. However, it is understood that the lead 102 can be etched away substantially or completely such that the routable trace 108 has physical characteristics of the lead 102 having being etched away, such as residues of material of the lead 102 or etch marks. In this example, the external plate 110 can be formed under and in direct contact with the routable trace 108. The external plate 110 can be formed with a bottom plating process on the routable trace 108.

The integrated circuit packaging system 100 can include a paddle 112, which is defined as a support structure for mounting a semiconductor thereon. The paddle 112 can made with the same material as the lead 102. The paddle 112 can include a bottom paddle side 114 and a top paddle side 116 opposite the bottom paddle side 114. The routable trace 108 can provide electrical connectivity between instances of the lead 102 or between the lead 102 and the paddle 112.

The routable trace 108 can be electrically connected to the lead 102. The routable trace 108 can be formed or placed directly on a portion of the top lead side 106, a portion of the top paddle side 116, or a combination thereof.

The paddle 112 can be attached to a paddle plate 118, which is defined as an attachment site providing electrical connection directly to the routable trace 108. The paddle plate 118 can be formed at the bottom paddle side 114 of the paddle 112 towards the environment outside of the integrated circuit package system 100.

In another example, the paddle 112 can be etched away substantially or completely. The paddle plate 118 can be formed on the routable trace 108 towards the environment outside of the integrated circuit package system 100. The routable trace 108 can have physical characteristics of the paddle 112 being etched away, such as residues of material of the paddle 112 or etch marks.

For example, the routable trace 108 can include an electrical connector attached to a top plate 126 with a routed circuit or a distribution layer (RDL). The top plate 126 is defined as a top cover for a portion of the routable trace 108 for providing electrical connectivity to the routable trace 108. The top plate 126 can be solder-wettable. The top plate 126 can be rust resistant, corrosion resistant, or generally resistant to environmental damage. Also for example, the routable trace 108 and the top plate 126 can each include a planar top surface. A portion of the routable trace 108 completely covers a side of the top plate 126 facing the routable trace 108.

The integrated circuit packaging system 100 can include an integrated circuit 120. The integrated circuit 120 is defined as a semiconductor device having active circuitry fabricated thereon. The routable trace 108 can route electrical connection or redistributes electrical signals between the integrated circuit 120 to the lead 102. The integrated circuit 120 can be over the routable trace 108. The integrated circuit 120 can be over the paddle 112. The integrated circuit 120 can include an inactive side 122 and an active side 124 opposite the inactive side 122. For example, the integrated circuit 120 can include a semiconductor device including a wirebond chip, a flip chip, or a silicon (Si) die. The integrated circuit 120 can be surrounded by an array of instances of the lead 102. The lead 102 can surround a periphery of the integrated circuit 120.

In one example, the integrated circuit 120 can be in a wire bond configuration. The integrated circuit 120 can include the inactive side 122 facing the top paddle side 116. The integrated circuit 120 can be mounted over the top paddle side 116 with an attachment layer 128, which is defined as an electrically insulating support material for the integrated circuit 120. The attachment layer 128 can be an adhesive material. The attachment layer 128 can be attached to the top paddle side 116 and the inactive side 122.

The integrated circuit packaging system 100 can include a die interconnect 130, which is defined as an electrically conductive connector connected or attached to the routable trace 108 and the active side 124. The integrated circuit packaging system 100 can include a plurality of the die interconnect 130. For example, the die interconnect 130 can represent an electrical connector including a wire interconnect, a bond wire, a conductive bump, a solder ball, or a combination thereof. For the wire bond configuration, the die interconnect 130 can be a bond wire.

In another example, the integrated circuit 120 can be in a flip chip configuration. The integrated circuit 120 can include the active side 124 facing the top paddle side 116. The integrated circuit 120 can be mounted over the top paddle side 116 with the attachment layer 128. The attachment layer 128 can be an underfill material. The attachment layer 128 can surround and cover multiple instances of the die interconnect 130 between the integrated circuit 120 and the paddle 112. The die interconnect 130 can be a solder ball in this example of the flip chip configuration.

The integrated circuit packaging system 100 can include an encapsulation 132, which is defined as a package cover of a semiconductor package to hermetically seal a semiconductor device providing mechanical and environmental protection. The encapsulation 132 can be formed covering or over the top lead side 106, the top paddle side 116, the routable trace 108, the integrated circuit 120, the attachment layer 128, and the die interconnect 130.

The encapsulation 132 can include a bottom encapsulation side 134 opposite from a top encapsulation side 136. A plane of the bottom encapsulation side 134 can be coplanar with any one of planes of the top lead side 106, the top paddle side 116, and a bottom side of the routable trace 108. The top encapsulation side 136 can be facing the environment outside of the integrated circuit packaging system 100.

The encapsulation 132 can include a hole 138. The hole 138 is defined as a void formed within the encapsulation 132 from the top encapsulation side 136. The hole 138 can expose the top lead side 106, the routable trace 108, the top plate 126, or a combination thereof. The hole 138 can be formed by a variety of processes, including laser ablation, drilling, etching, or particle bombardment.

The hole 138 can be optionally filled with a conductive fill 140. The conductive fill 140 is defined as a conductive material. The conductive fill 140 can be placed in the hole 138 and then reflowed. The conductive fill 140 can be flowed into the hole 138 at or above a melting temperature of the conductive fill 140. For example, the conductive fill 140 can be solder, conductive paste, or conductive adhesive. The conductive fill 140 can fill the hole 138 completely or partially. The conductive fill 140 can have a lower volume than the hole 138. The conductive fill 140 can also have a higher volume than the hole 138, and thus protruding out and away from the hole 138 above the top encapsulation side 136. The conductive fill 140 can harden within the hole 138 in the encapsulation 132.

The integrated circuit packaging system 100 can include a protective coat 144, which is defined as a protection layer of a thermoset material with delamination resistance that protects a portion of the bottom extent of the routable trace 108. The protective coat 144 can include an insulation material including a passivation, a solder resist, an epoxy, or an adhesive. A coating of a protective material or layer, as shown with the protective coat 144, can be applied for protection or security of circuit or trace, as shown with the routable trace 108 for example. The protective coat 144 can be provided for protections from chemical etch out after assembly or undesired environmental conditions.

The protective coat 144 can be in a molding compound, a film material, a viscous encapsulant material that hardens when cured, but is not limited to these forms provided. The protective coat 144 is a thermoset material and has delamination resistance.

The protective coat 144 can be formed or applied directly on portions of the lead 102, the paddle 112, the routable trace 108, the encapsulation 132, the external plate 110, or a combination thereof. The protective coat 144 can be formed or applied between the lead 102 and another instance of the lead 102. The protective coat 144 can be formed or applied between the external plate 110 and another instance of the external plate 110. The protective coat 144 can be formed or applied between the lead 102 and the paddle 112. The protective coat 144 can be formed or applied on a non-horizontal side of the lead 102 bordering an outer extent of the integrated circuit packaging system 100.

The protective coat 144 can electrically isolate the lead 102 from another instance of the lead 102. The protective coat 144 can electrically isolate the lead 102 from the paddle 112. The protective coat 144 can be formed surrounding the lead 102 and the paddle 112. The protective coat 144 can electrically isolate the routable trace 108 from another of the routable trace 108.

The protective coat 144 can include a bottom coat side 146 and a top coat side 148 opposite the bottom coat side 146. A plane of the bottom coat side 146 can be coplanar with any one of planes of the bottom lead side 104 and the bottom paddle side 114. For example, a plane of the bottom coat side 146 can be coplanar with any one of planes of a bottom extent of the external plate 110 and a bottom extent of the paddle plate 118.

For illustrative purposes, a plane of the bottom coat side 146 is shown coplanar with planes of the bottom lead side 104 and the bottom paddle side 114, although it is understood that a plane of the bottom coat side 146 can be non-coplanar with any one of planes of the bottom lead side 104 and the bottom paddle side 114. For example, a plane of the bottom coat side 146 can be lower or below any of planes of the bottom lead side 104 and the bottom paddle side 114.

A portion of the routable trace 108 can be in direct contact with both the encapsulation 132 and the protective coat 144. The portion of the routable trace 108 can be connected to another portion of the routable trace 108 under the integrated circuit 120 or under the top plate 126 exposed by the hole 138.

The integrated circuit packaging system 100 can include an external interconnect 150, which is defined as an electrically conductive connector connected or attached to the external plate 110 and the external system. The integrated circuit packaging system 100 can include a plurality of the external interconnect 150.

For example, the external interconnect 150 can include a conductive ball. Also for example, the external interconnect 150 can be formed with a conductive material including solder, a metal, or a metallic alloy. For a specific example, the external interconnect 150 can represent a solder ball for enhancing board level reliability (BLR) performance.

For example, the external plate 110 can have a flat top side and a flat bottom side and have a constant thickness. The external interconnect 150 can be attached to a bottom extent of the external plate 110. The external plate 110 can include bottom and top extents such that an entirety of a bottom extent of the external plate 110 can include a plane approximately parallel to a plane of an entirety of a top extent of the external plate 110. The external plate 110 can also be of another shape, such as having a cup shape for catching the external interconnect 150 by partially or completely surrounding the external interconnect 150.

Quad Flat No-Lead Stand-off Terminal (QFNs-st) multi-row packages have a problem with long wire spans and difficult wire-crossings. Longer wire span causes more wire usage and high cost of assembly. Due to complexity of bonding layout, another problem can occur with larger package sizes for Quad Flat No-Lead Stand-off Terminal (QFNs-st) packages require more expensive mold system. Embodiments of the present invention provide solutions or answers to the problem.

It has been discovered that the conductive fill 140 protected by the encapsulation 132 electrically connected to the routable trace 108 directly through the top plate 126 provides package size reduction, slimmer package height, shorter wire span, better thermal conductance, and elimination of complex bond layout.

It has also been discovered that the encapsulation 132 having the hole 138 and on the protective coat 144 provides structural integrity of the integrated circuit packaging system 100 including holding together and maintaining coplanarity of instances of the lead 102 during the lead metal removal stage and hole formation stage of manufacturing, such as processes including etching and laser ablation.

It has been discovered that the conductive fill 140 in the hole 138 of the encapsulation 132 protects the routable trace 108 from electrical disconnection with the lead 102 due to thermal distortion. The routable trace 108 and the lead 102 are sources of thermal conduction and can be subject to electrical disconnection from thermal distortion if wires or solder balls are used. However, the conductive fill 140 within the hole 138 of the encapsulation 132 is resistant to electrical disconnection during thermal expansion, and thereby prevents electrical disconnection to the routable trace 108 and the lead 102 even with thermal distortion.

It has been discovered that the routable trace 108 between the encapsulation 132 and the protective coat 144 improves reliability by isolating instances of the routable trace 108 and the lead 102 from one another, thereby eliminating solder creep or electrical shorts. The protective coat 144 and the encapsulation 132 in contact with each other also improve reliability by firmly holding instances of the routable trace 108 and the lead 102 together preventing distortion and electrical disconnection.

Referring now to FIG. 2, therein is shown an isometric view of the integrated circuit packaging system 100 with the encapsulation 132 of FIG. 1 depicted in dotted lines. The exemplary isometric view is shown with the encapsulation 132 being semi-transparent, although it is understood that the encapsulation 132 is not actually semi-transparent. For illustrative purposes, the hole 138 is depicted by a truncated cone shape in FIG. 2, although it is understood that the hole 138 is a void in the encapsulation 132 and cannot be seen without the encapsulation 132.

The routable trace 108 can include the top plate 126. The top plate 126 can be directly on the top lead side 106 of FIG. 1. An array of multiple instances of the top plate 126 can be distributed over a surface of each of the top lead side 106 or the top paddle side 116 of FIG. 1. An array of the top plate 126 can be a physical arrangement or distribution of multiple instances of the top plate 126 over a surface area of the top lead side 106, the top paddle side 116, or a combination thereof. The array includes multiple instances of the top plate 126 that is fully populated, evenly spaced, or a combination thereof.

The array of the top plate 126 can be outside of a perimeter of the integrated circuit 120. The array can also be within the perimeter of the integrated circuit 120 such that a central portion of the integrated circuit 120 can be directly over the array of the multiple instances of the top plate 126 (not shown). The hole 138 of the encapsulation 132 can be formed on each instance of the top plate 126 in the array in the encapsulation 132.

The routable trace 108 can be directly on portions of the lead 102 of FIG. 1 and the paddle 112 of FIG. 1. For example, the routable trace 108 can include an electrical connector including a distribution trace or a routed layer. The die interconnect 130 can be directly on the routable trace 108. The routable trace 108 can be directly on a portion of the paddle 112. An array of multiple instances of the routable trace 108 can be formed adjacent to or surrounding a perimeter of the integrated circuit 120. The array of the routable trace 108 can be a physical arrangement or distribution of the multiple instances of the routable trace 108. The array includes a row of the multiple instances of the routable trace 108. The array can include the multiple instances of the routable trace 108 that is evenly spaced. The top plate 126 can be directly on portions of the routable trace 108.

The attachment layer 128 of FIG. 1 can be directly on a portion of the routable trace 108 under the integrated circuit 120. For example, the attachment layer 128 can be directly on a portion of the routable trace 108 and the top plate 126 that are directly under the integrated circuit 120.

The protective coat 144 can be formed or applied directly on portions of the lead 102, the paddle 112, the routable trace 108, the encapsulation 132, or a combination thereof. The protective coat 144 can be applied on the etched portion of the lead 102 to protect portions of the routable trace 108 that are exposed.

Figure 3:
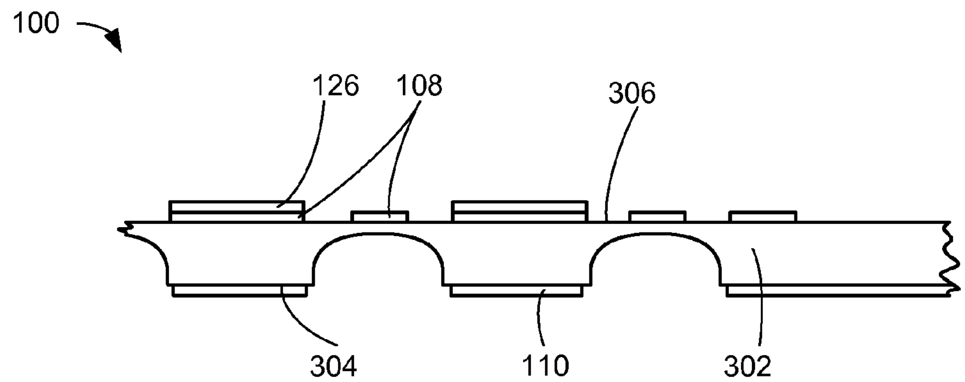
FIG. 3 is a cross-sectional view of the integrated circuit packaging system of FIG. 1 in a leadframe plating stage of manufacturing of the integrated circuit packaging system along line 1-1 of FIG. 2.

Referring now to FIG. 3, therein is shown a cross-sectional view of the integrated circuit packaging system 100 of FIG. 1 in a leadframe plating stage of manufacturing of the integrated circuit packaging system along line 1-1 of FIG. 2. The integrated circuit packaging system 100 can include a leadframe 302, which is defined as a conductive structure having multiple instances of the lead 102 for mounting and connecting a semiconductor device thereto. FIG. 3 depicts a portion of the leadframe 302. The leadframe 302 can be formed with an electrically conductive material including copper (Cu), copper alloy, nickel, iron-nickel alloy, any other metallic material, or a combination thereof.

The leadframe 302 can include a bottom leadframe side 304 and a top leadframe side 306 opposite the bottom leadframe side 304. A portion of the leadframe 302 at the bottom leadframe side 304 can be partially removed. The partially removal can include etching, drilling, or cutting.

As an example, the leadframe 302 can be provided with a structure pre-etched at the bottom leadframe side 304. As another example, the leadframe 302 can be provided with a structure that is not pre-etched and will be etched in a subsequent phase.

The integrated circuit packaging system 100 can include the external plate 110 formed at the bottom leadframe side 304. The external plate 110 can be formed with a number of layers. The external plate 110 can be formed with a lead plate conductive material, which is defined as an electrically conductive material including a metallic material or a metal alloy.

For example, the lead plate conductive material can include nickel (Ni), palladium (Pd), gold (Au), a metal alloy, or a combination thereof. For a specific example, the lead plate conductive material can include nickel-palladium (NiPd) or nickel-palladium-gold (NiPdAu).

As an example, the external plate 110 can be formed with a plating process. As another example, the external plate 110 can include a structure of a build-up pre plated frame (PPF). The external plate 110 can be formed with the routable trace 108, or can be formed after a lead metal removal stage of manufacturing described in FIG. 7.

The integrated circuit packaging system 100 can include the routable trace 108 formed directly on the top leadframe side 306. The routable trace 108 can be provided on the top leadframe side 306 as part of the lead frame 302. The routable trace 108 can be formed with a number of layers. The routable trace 108 can be formed with a distribution layer conductive material, which is defined as an electrically conductive material including a metallic material or a metal alloy. For example, the distribution layer conductive material can include nickel (Ni), gold (Au), gold (Au) alloy, silver (Ag), a metal alloy, or a combination thereof.

As a specific example, the distribution layer conductive material can optionally include copper (Cu) or palladium (Pd). As another specific example, the distribution layer conductive material can include a multi-layer combination of gold (Au), gold alloy, palladium (Pd), nickel (Ni), copper (Cu), nickel (Ni), palladium (Pd), silver (Ag), or a combination thereof. As another specific example, the routable trace 108 can include a five-layer combination, a seven-layer combination, or a three layer combination of conductive materials.

As an example, the routable trace 108 can be formed with a plating process. As another example, the routable trace 108 can include a structure of a build-up pre plated frame (PPF).

In another embodiment, the routable trace 108 can be formed directly on a conductive layer on the top leadframe side 306. In a further embodiment, the routable trace 108 can be formed over a portion of the leadframe 302 that has been pre-etched. In a yet further embodiment, a middle or central portion the leadframe 302 can include an array of conductive plates at the bottom leadframe side 304, an array of distribution layers at the top leadframe side 306, or a combination thereof. For example, the routable trace 108 provides a fused or joined terminal option for ground bond or common voltage leads.

The leadframe 302 can have the top plate 126 formed over each of the lead 102 on the routable trace 108. The top plate 126 can be deposited on or plated onto the routable trace 108 in the leadframe plating stage of manufacturing.

Figure 4:
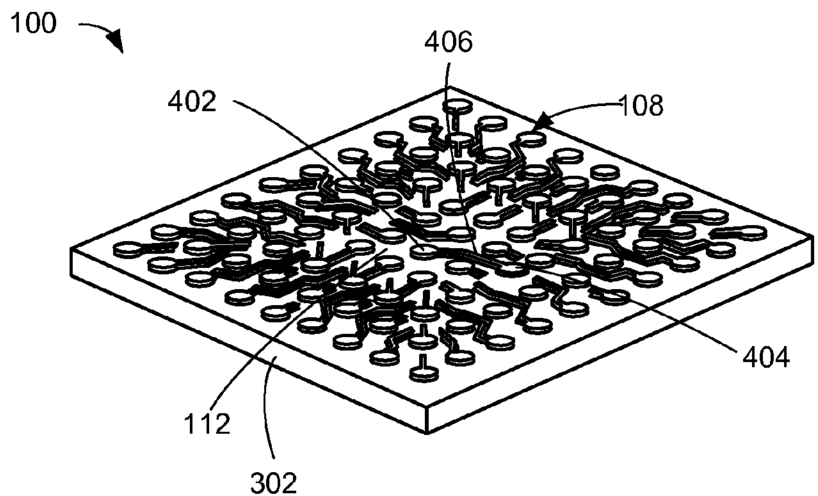
FIG. 4 is an isometric view of the integrated circuit packaging system of FIG. 1 in the leadframe plating stage of manufacturing of the integrated circuit packaging system.

Referring now to FIG. 4, therein is shown an isometric view of the integrated circuit packaging system 100 of FIG. 1 in the leadframe plating stage of manufacturing of the integrated circuit packaging system. The leadframe 302 shown can be a leadframe prior to singulation.

The routable trace 108 can include a first contact 402 electrically connected to a second contact 404. The routable trace 108 can include a trace line 406 electrically connected to the first contact 402 and the second contact 404. The first contact 402 and the second contact 404 can be defined as end point structures of the routable trace 108. The trace line 406 can be defined as a conductive portion of the routable trace 108 for connecting the first contact 402 and the second contact 404.

The first contact 402 and a portion of the trace line 406 can be directly under the integrated circuit 120. The second contact 404 and another portion of the trace line 406 can be outside a perimeter of the integrated circuit 120. For example, the routable trace 108 can distribute a ground signal from the first contact 402 to the second contact 404.

The first contact 402 and a portion of the trace line 406 can be directly on a portion of the paddle 112 of FIG. 1. The second contact 404 and another portion of the trace line 406 can be directly on a portion of the lead 102.

The attachment layer 128 of FIG. 1 can be later deposited directly on a portion of the routable trace 108 that is under the integrated circuit 120 (not shown). For example, the attachment layer 128 can be directly on a portion of the trace line 406 and the first contact 402 that are directly under the integrated circuit 120.

For illustrative purposes, the first contact 402 and the second contact 404 are shown having circular shapes, although it is understood that the first contact 402 and the second contact 404 can include any shapes. For example, the first contact 402 can include a rectangular shape.

The first contact 402 can have the top plate 126 formed thereon (not shown). The second contact 404 can have the top plate 126 thereon in the leadframe plating stage of manufacturing.

For illustrative purposes, the top plate 126 and ends of the routable trace 108 are shown having circular and rectangular shapes, respectively, although it is understood that the top plate 126 and the ends of the routable trace 108 can include any shapes. For example, the top plate 126 can include an elliptical shape or an oval shape.

Figure 5:
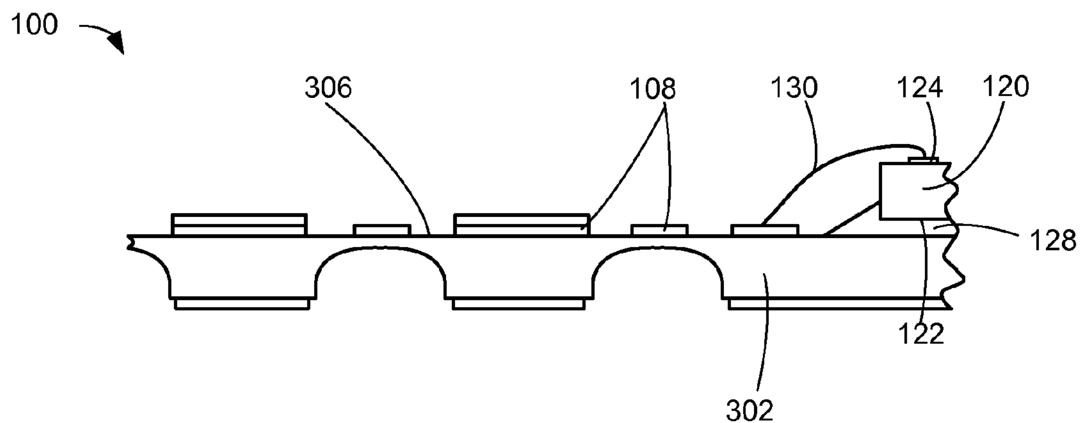
FIG. 5 is a cross-sectional view of the integrated circuit packaging system of FIG. 1 in a die attachment stage of manufacturing of the integrated circuit packaging system along line 1-1 of FIG. 2.

Referring now to FIG. 5, therein is shown a cross-sectional view of the integrated circuit packaging system

100 of FIG. 1 in a die attachment stage of manufacturing of the integrated circuit packaging system along line 1-1 of FIG. 2.

The integrated circuit packaging system 100 can include a die attachment method to mount the integrated circuit 120 over the leadframe 302. The integrated circuit 120 can include the inactive side 122 facing the top leadframe side 306. The integrated circuit 120 can be attached to the top leadframe side 306 with the attachment layer 128.

The integrated circuit packaging system 100 can include the die interconnect 130 attached to the routable trace 108 and the active side 124. For illustration purposes, the integrated circuit 120 is shown as a wire bonded die. However, it is understood that the integrated circuit 120 can be a flip chip, the attachment layer 128 can be an underfill, and the die interconnect 130 can be a solder ball connecting the active side 124 with the top leadframe side 306.

For illustrative purposes, the die interconnect 130 is shown as a bond wire, although it is understood that the die interconnect 130 can include any other electrically conductive connectors. For example, the die interconnect 130 can represent a conductive bump, a conductive stud, or a conductive paste. Also for example, the die interconnect 130 can be formed with a conductive material including solder, a metal, or a metallic alloy.

Figure 6:
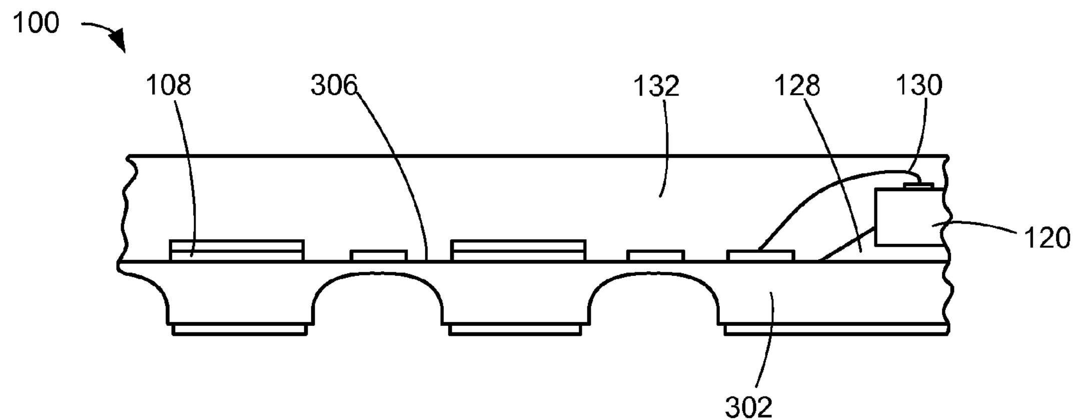
FIG. 6 is a cross-sectional view of the integrated circuit packaging system of FIG. 1 in an encapsulation stage of manufacturing of the integrated circuit packaging system along line 1-1 of FIG. 2.

Referring now to FIG. 6, therein is shown a cross-sectional view of the integrated circuit packaging system 100 of FIG. 1 in an encapsulation stage of manufacturing of the integrated circuit packaging system along line 1-1 of FIG. 2. The integrated circuit packaging system 100 can include a molding process including liquid epoxy mold to form the encapsulation 132.

For example, the encapsulation 132 can be molded over the leadframe 302, the routable trace 108, the integrated circuit 120, and the die interconnect 130. The encapsulation 132 can be formed covering the top leadframe side 306, the routable trace 108, the attachment layer 128, the integrated circuit 120, and the die interconnect 130. The encapsulation 132 can be cured after the encapsulation 132 is molded over the leadframe 302.

Figure 7:
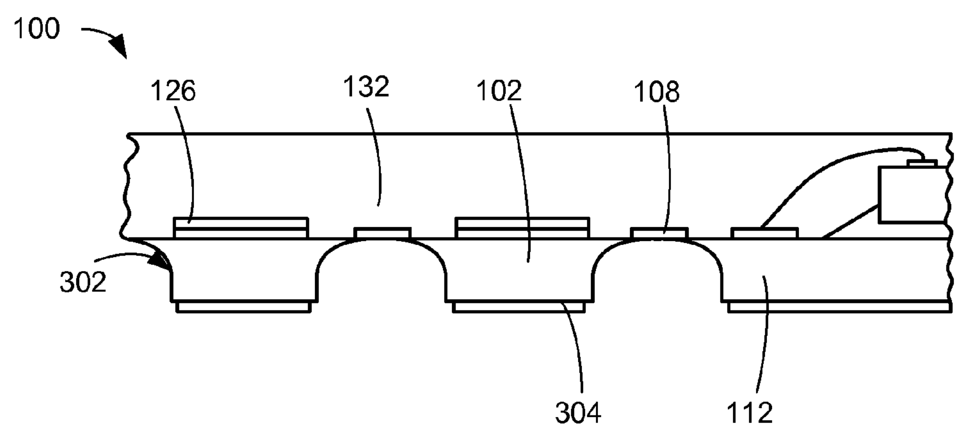
FIG. 7 is a cross-sectional view of the integrated circuit packaging system of FIG. 1 in a lead metal removal stage of manufacturing of the integrated circuit packaging system along line 1-1 of FIG. 2.

Referring now to FIG. 7, therein is shown a cross-sectional view of the integrated circuit packaging system 100 of FIG. 1 in a lead metal removal stage of manufacturing of the integrated circuit packaging system along line 1-1 of FIG. 2. The integrated circuit packaging system 100 can include a removal process including etching.

The removal process does not affect or remove the routable trace 108. For example, the removal process can include a copper (Cu) etching. The removal process can function to remove portions of the leadframe 302 from the bottom leadframe side 304 to isolate each of the lead 102 and the paddle 112. Removal of the portion of the leadframe 302 between instances of the lead 102 can expose a bottom portion of the routable trace 108.

For illustrative purposes, the removal process is shown to only remove portions of the leadframe 302 to isolate each of the lead 102, although it is understood that alternatively, the entirety of the leadframe 302 can be removed with the routable trace 108 and the top plate 126 held together by the encapsulation 132. The leadframe 302 can serve as a sacrificial lead frame used to provide an ultra slim integrated circuit package.

It has been discovered removing the lead 102 entirely leaving with the routable trace 108 held together by the encapsulation 132 can provide slim integrated circuit packages with high thermal dissipation properties by providing the pattern for the routable trace 108 from the leadframe 302 and removing the leadframe 302 in a removal stage, thereby creating an ultra slim integrated circuit package over only metallic contacts without a bulky substrate.

Figure 8:
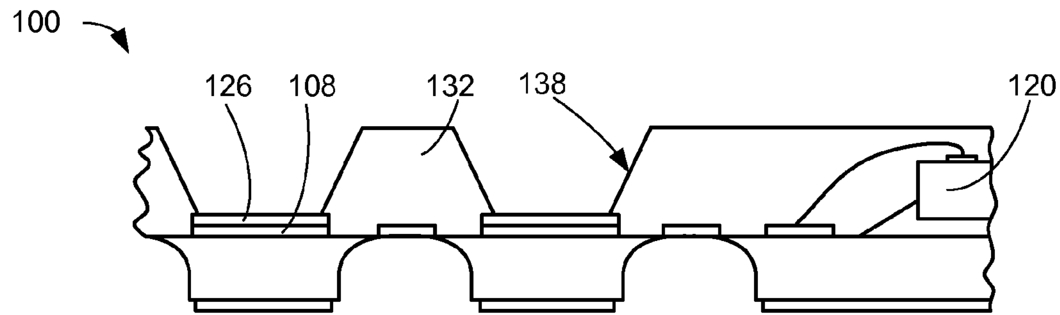
FIG. 8 is a cross-sectional view of the integrated circuit packaging system of FIG. 1 in a hole formation stage of manufacturing of the integrated circuit packaging system along line 1-1 of FIG. 2.

Referring now to FIG. 8, therein is shown a cross-sectional view of the integrated circuit packaging system 100 of FIG. 1 in a hole formation stage of manufacturing of the integrated circuit packaging system along line 1-1 of FIG. 2.

The hole 138 can be formed through the encapsulation 132 exposing the top plate 126 or the routable trace 108. The hole 138 can be formed by drilling, etching, lasering, or by removing a mold chase. The hole 138 can be formed on a peripheral extent of the encapsulation 132. Multiple instances of the hole 138 can be formed uniformly across the encapsulation 132 around the integrated circuit 120. The encapsulation 132 can have characteristics of having been formed with a laser, including burn marks, melt marks, carbon residues, or a combination thereof on a surface bounding the hole 138.

Figure 9:
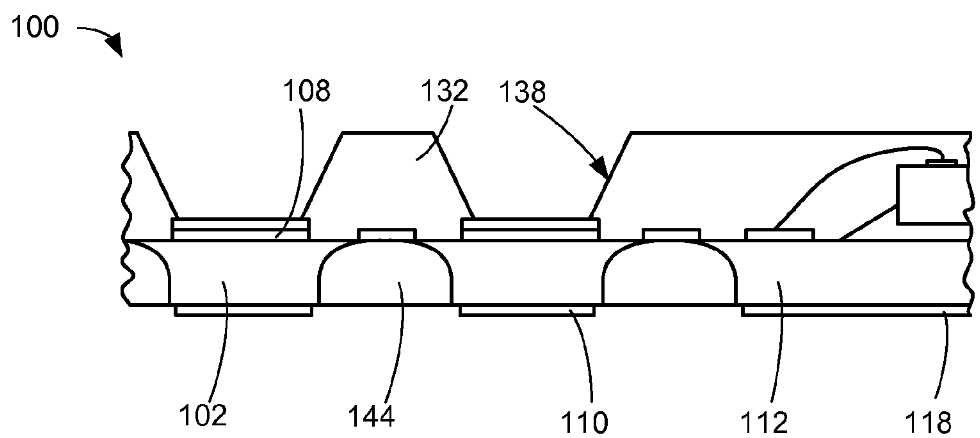
FIG. 9 is a cross-sectional view of the integrated circuit packaging system of FIG. 1 in a protective filling stage of manufacturing of the integrated circuit packaging system along line 1-1 of FIG. 2.

Referring now to FIG. 9, therein is shown a cross-sectional view of the integrated circuit packaging system 100 of FIG. 1 in a protective filling stage of manufacturing of the integrated circuit packaging system along line 1-1 of FIG. 2.

The integrated circuit packaging system 100 can include a protective coating method including screen print, spin-coat, dispense, or capillary action. For example, the protective filling stage can include forming a bottom trace protective layer, as shown with the protective coat 144, after the lead metal removal process.

The integrated circuit packaging system 100 can include the protective coat 144 applied or filled directly on portions of the lead 102, horizontal extents of the external plate 110, the paddle 112, the paddle plate 118, the routable trace 108, and the encapsulation 132. The protective coat 144 can be applied between instances of the lead 102. For example, the protective coat 144 can provide protection for an exposed circuit, as shown by the routable trace 108 partially exposed after the lead metal removal phase, from environmental hazards and elements.

The protective coat 144 can protect bottom surfaces of the routable trace 108 and the lead 102. The protective coat 144 can electrically isolate the lead 102 and another of the lead 102. The protective coat 144 can be formed surrounding each instance of the lead 102 or the paddle 112. Alternatively, the protective coat 144 can be formed between instances of the routable trace 108 where the lead 102 has been removed or etched away. The peripheral lead horizontal ridge 110.

It has been discovered the protective coat 144 can provide structural integrity after the hole 138 is formed in the encapsulation 132 by preventing distortion in thermal expansion and ensuring the co-planarity of instances of the lead 102 or the routable trace 108.

In a subsequent phase, the integrated circuit packaging system 100 can include a package singulation process to produce individual units or packages of the integrated circuit packaging system 100. The package singulation process can include a mechanical or optical process.

Figure 10:
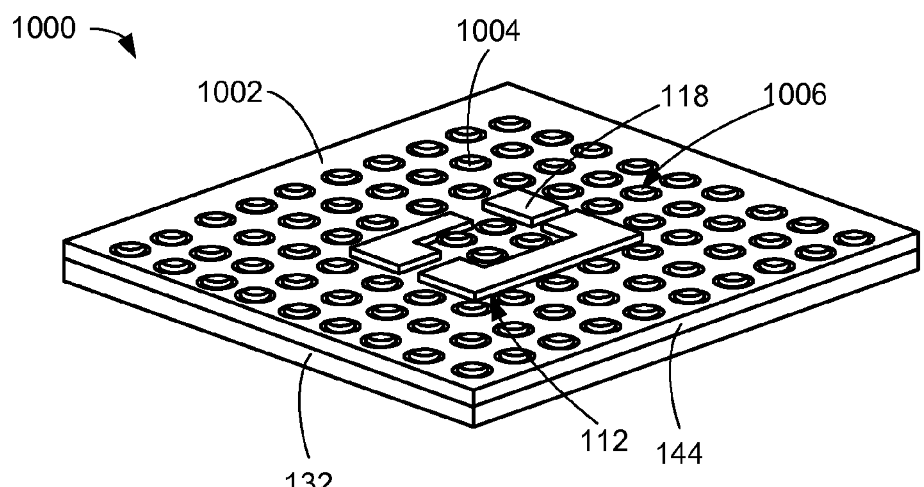
FIG. 10 is a bottom isometric view of an integrated circuit packaging system in a second embodiment of the present invention.

Referring now to FIG. 10, therein is shown a bottom isometric view of an integrated circuit packaging system 1000 in a second embodiment of the present invention. The integrated circuit packaging system 1000 can include a lead 1002 and an external plate 1004. The lead 1002 is defined as a structure that provides connectivity for electrical signals or electrical potential levels between the integrated circuit packaging system 1000 and an external system (not shown).

The lead 1002 is similar to the lead 102 of FIG. 1 in most aspects except that the lead 1002 has a cup shape structure on its bottom side.

The lead 1002 can be attached to the external plate 1004, which is defined as a conductive structure to provide electrical connection directly to the lead 1002. The external plate 1004 can be formed at the bottom lead side 104 of FIG. 1. The external plate 1004 can be plated or deposited onto the lead 1002. The external plate 1004 can have a cup shape for catching the external interconnect 150 of FIG. 1 (not shown) by partially or completely surrounding the external interconnect 150.

As shown, the external plate 1004 can have recess 1006. The recess 1006 can provide locking enhancement with the external interconnect 150 for board level reliability improvement. The ball catch structure is defined by the external plate 1004 with the recess 1006 provide a reliable connection site to attach the external interconnect 150 to the lead 102. For illustrative purposes, the external plate 1004 is shown with the recess 1006, although it is understood that the external plate 1004 can be formed without the recess 1006.

The external plate 1004 and the lead 1002 can be surrounded by the protective coat 144. The protective coat 144 can be in direct contact with the encapsulation 132. The paddle 112 can be partially exposed from the protective coat 144.

The integrated circuit packaging system 1000 can include multiple instances of the paddle 112 each having the paddle plate 118 attached. Multiple instances of the external plate 1004 can be between the paddle plate 118 and another instance of the paddle plate 118.

Figure 11:
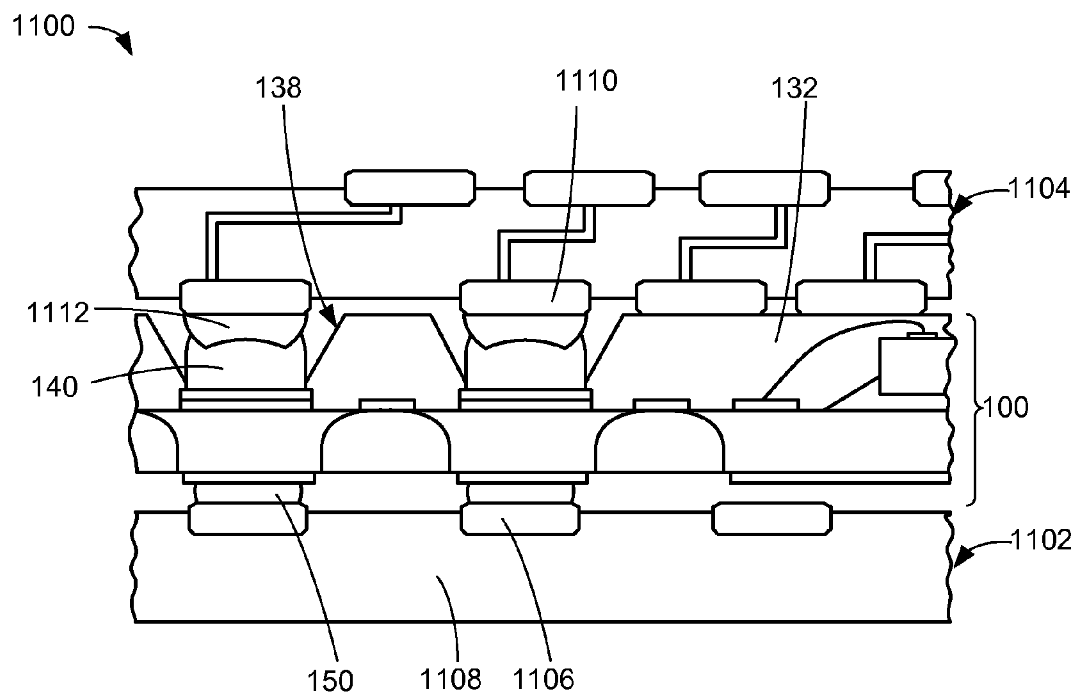
FIG. 11 is a cross-sectional view of an integrated circuit packaging system as exemplified by the isometric view along line 1-1 of FIG. 2 in a third embodiment of the present invention.

Referring now to FIG. 11, therein is shown a cross-sectional view of an integrated circuit packaging system 1100 as exemplified by the isometric view along line 1-1 of FIG. 2 in a third embodiment of the present invention. The integrated circuit packaging system 1100 can include the integrated circuit packaging system 100 of FIG. 1 mounted on an external board 1102. The integrated circuit packaging system 1100 can also include a top package substrate 1104 mounted on the integrated circuit packaging system 100.

The external board 1102 is defined as a structure having electrical contacts thereon. The integrated circuit packaging system 100 can be mounted on the external board 1102 by the external interconnect 150. The external interconnect 150 can be reflowed to attach on a board contact 1106 of the external board 1102. The board contact 1106 is defined as an electrical contact attached to a board body 1108 of the external board 1102. For example, the external board 1102 can be a ceramic substrate, a laminate substrate, a multi-layer substrate, or a printed circuit board.

The top package substrate 1104 is defined as a structure having electrical contacts on two opposite sides of the structure with electrical connections between the two opposite sides. The top package substrate 1104 can be electrically connected and be mounted on the integrated circuit packaging system 100. The top package substrate 1104 can include a substrate bottom contact 1110. The substrate bottom contact 1110 is defined as a site for electrical connection for the top package substrate 1104.

The integrated circuit packaging system 1100 can include a package interconnect 1112. The top package substrate 1104 can be attached to the conductive fill 140 in the hole 138 of the integrated circuit packaging system 100 through the package interconnect 1112. The package interconnect 1112 is defined as a conductive material attached to the substrate bottom contact 1110. The package interconnect 1112 can be a conductive material that is solder-wettable or that can be melt together with solder. The top package substrate 1104 can be in direct contact with the encapsulation 132. The top package substrate 1104 can also be spaced apart from the encapsulation 132 by the package interconnect 1112, before or after reflow of the package interconnect 1112.

Alternatively, the substrate bottom contact 1110 can be attached to the conductive fill 140 in the hole 138 of the integrated circuit packaging system 100 directly (not shown) without the package interconnect 1112. The top package substrate 1104 can be in direct contact with and supported by the encapsulation 132.

Figure 12:
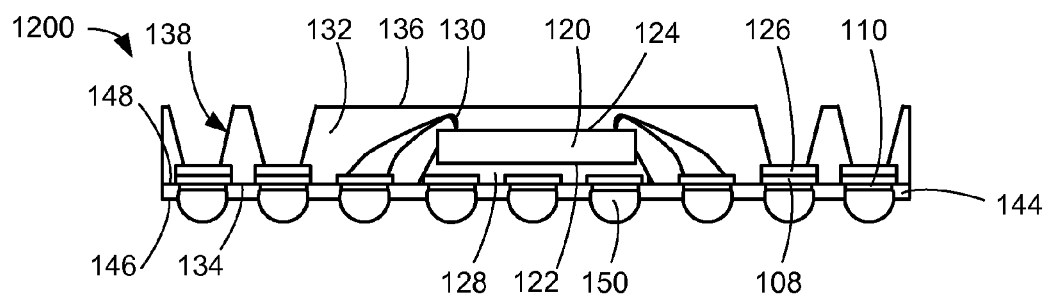
FIG. 12 is a cross-sectional view of an integrated circuit packaging system as exemplified by the isometric view along line 1-1 of FIG. 2 in a fourth embodiment of the present invention.

Referring now to FIG. 12, therein is shown a cross-sectional view of an integrated circuit packaging system 1200 as exemplified by the isometric view along line 1-1 of FIG. 2 in a fourth embodiment of the present invention.

The integrated circuit packaging system 1200 can include the routable trace 108, which is defined as a structure for providing electrical connectivity. The routable trace 108 can be, for example, a metal layer. The routable trace 108 can have characteristics of having been plated onto the lead 102 of FIG. 1 (not shown) that is later etched away. The characteristics of having been plated onto the lead 102 includes etch marks, chemical residue, metal residue from the lead 102, or a combination thereof.

The routable trace 108 can be attached to the external plate 110, which is defined as a conductive structure to provide electrical connection directly to the routable trace 108. The external plate 110 can also be formed under the routable trace 108. For example, the external plate 110 can be formed with bottom plating process on a bottom side of the routable trace 108.

The integrated circuit packaging system 1200 can include multiple instances of the routable trace 108. For example, the routable trace 108 can include an electrical connector attached to the top plate 126 with a routed circuit or a distribution layer (RDL). The top plate 126 is defined as a top cover for a portion of the routable trace 108 for providing electrical connectivity to the routable trace 108. The top plate 126 can be solder-wettable. The top plate 126 can be rust resistant, corrosion resistant, or generally resistant to environmental damage.

The integrated circuit packaging system 1200 can include the integrated circuit 120. The routable trace 108 can route electrical connection or redistributes electrical signals between the integrated circuit 120 to another instance of the routable trace 108. The integrated circuit 120 is defined as a semiconductor device. The integrated circuit 120 can be over the routable trace 108. The integrated circuit 120 can include the inactive side 122 and the active side 124 opposite the inactive side 122. For example, the integrated circuit 120 can include a semiconductor device including a wirebond chip, a flip chip, or a silicon (Si) die.

The integrated circuit 120 can include the inactive side 122 facing the routable trace 108. The integrated circuit 120 can be mounted over the routable trace 108 with the attachment layer 128, which is defined as an attachment material with adhesive property. The attachment layer 128 can be an adhesive material or an underfill material.

The integrated circuit 120 can be surrounded by an array of instances of the routable trace 108. The routable trace 108 can surround a periphery of the integrated circuit 120.

The integrated circuit packaging system 1200 can include the die interconnect 130, which is defined as an electrically conductive connector connected or attached to the routable trace 108 and the active side 124. The integrated circuit packaging system 1200 can include a plurality of the die interconnect 130. For example, the die interconnect 130 can represent an electrical connector including a wire interconnect, a bond wire, a conductive bump, a solder ball, or a combination thereof.

The integrated circuit packaging system 1200 can include the encapsulation 132, which is defined as a package cover of a semiconductor package to seal a semiconductor device providing mechanical and environmental protection. The encapsulation 132 can be formed covering or over the routable trace 108, the integrated circuit 120, the attachment layer 128, and the die interconnect 130.

The encapsulation 132 can include the bottom encapsulation side 134 opposite from the top encapsulation side 136. A plane of the bottom encapsulation side 134 can be coplanar with a bottom extent of the routable trace 108. The top encapsulation side 136 can be facing towards an outer extent of the integrated circuit packaging system 1200.

The encapsulation 132 can include the hole 138. The hole 138 is defined as a void formed within the encapsulation 132 from the top encapsulation side 136. The hole 138 can expose the routable trace 108, the top plate 126, or a combination thereof. The hole 138 can be formed by a variety of processes, including laser ablation, drilling, etching, or particle bombardment.

The hole 138 can be optionally filled with the conductive fill 140 of FIG. 1 (not shown). The conductive fill 140 is defined as a conductive material. The conductive fill 140 can be placed in the hole 138 and then reflowed. The conductive fill 140 can be flowed into the hole 138 at a melting temperature of the conductive fill 140. For example, the conductive fill 140 can be solder, conductive paste, or conductive adhesive. The conductive fill 140 can fill the hole 138 completely or partially. The conductive fill 140 can have a higher volume than the hole 138, and thus protruding out and away from the hole 138 above the top encapsulation side 136.

The integrated circuit packaging system 1200 can include the protective coat 144, which is defined as a protection layer that protects a portion of the bottom extent of the routable trace 108. The protective coat 144 can include an insulation material including a passivation, a solder resist, an epoxy, or an adhesive. A coating of a protective material or layer, as shown with the protective coat 144, can be applied for protection or security of circuit or trace, as shown with the routable trace 108 for example. The protective coat 144 can be provided for protections from chemical etch out after assembly or undesired environmental conditions.

The protective coat 144 can be formed or applied directly on portions of the routable trace 108, the external plate 110 the encapsulation 132, or a combination thereof. The protective coat 144 can be formed or applied between the routable trace 108 and another instance of the routable trace 108. The protective coat 144 can electrically isolate the routable trace 108 from another instance of the routable trace 108. The protective coat 144 can be formed surrounding the routable trace 108.

The protective coat 144 can include the bottom coat side 146 and the top coat side 148 opposite the bottom coat side 146. A plane of the top coat side 148 can be coplanar with one side of the routable trace 108. For example, a plane of the bottom coat side 146 can be coplanar with a bottom extent of the external plate 110.

For illustrative purposes, a plane of the top coat side 148 is shown coplanar with the plane of one side of the routable trace 108, although it is understood that a plane of the top coat side 148 can be non-coplanar with the routable trace 108. For example, a plane of the bottom coat side 146 can be lower or below any of planes of the external plate 110.

The integrated circuit packaging system 1200 can include the external interconnect 150, which is defined as an electrically conductive connector connected or attached to the external plate 110 and the external system. The integrated circuit packaging system 1200 can include multiple instances of the external interconnect 150.

For example, the external interconnect 150 can include a conductive ball. Also for example, the external interconnect 150 can be formed with a conductive material including solder, a metal, or a metallic alloy. For a specific example, the external interconnect 150 can represent a solder ball for enhancing board level reliability (BLR) performance.

For example, the external plate 110 can have a flat top side and a flat bottom side and have a constant thickness. The external interconnect 150 can be attached to a bottom extent of the external plate 110. The external plate 110 can include bottom and top extents such that an entirety of a bottom extent of the external plate 110 can include a plane approximately parallel to a plane of an entirety of a top extent of the external plate 110. The external plate 110 can also be of another shape, such as having a cup shape for catching the external interconnect 150 by partially or completely surrounding the external interconnect 150.

It has been discovered that the conductive fill 140 protected by the encapsulation 132 electrically connected to the routable trace 108 directly through the top plate 126 provides package size reduction, slimmer package height, shorter wire span, better thermal conductance, and elimination of complex bond layout.

It has also been discovered that the encapsulation 132 having the hole 138 and on the protective coat 144 provides structural integrity of the integrated circuit packaging system 100 including holding together and maintaining coplanarity of instances of the lead 102 during the lead metal removal stage and hole formation stage of manufacturing, such as processes including etching and laser ablation.

It has been discovered that the conductive fill 140 in the hole 138 of the encapsulation 132 protects the routable trace 108 from electrical disconnection with the lead 102 due to thermal distortion. The routable trace 108 and the lead 102 are sources of thermal conduction and can be subject to electrical disconnection from thermal distortion if wires or solder balls are used. However, the conductive fill 140 within the hole 138 of the encapsulation 132 is resistant to electrical disconnection during thermal expansion, and thereby prevents electrical disconnection to the routable trace 108 and the lead 102 even with thermal distortion.

It has been discovered that the routable trace 108 between the encapsulation 132 and the protective coat 144 improves reliability by isolating instances of the routable trace 108 and the lead 102 from one another, thereby eliminating solder creep or electrical shorts. The protective coat 144 and the encapsulation 132 in contact with each other also improve reliability by firmly holding instances of the routable trace 108 and the lead 102 together preventing distortion and electrical disconnection.

It has been discovered removing the lead 102 entirely leaving with the routable trace 108 held together by the protective coat 144 and the encapsulation 132 having the hole 138 can provide slim integrated circuit packages with high thermal dissipation properties by providing the pattern for the routable trace 108 from the leadframe 302 and removing the leadframe 302 in a removal stage, thereby creating an ultra slim integrated circuit package over only metallic contacts without a bulky substrate.

Figure 13:
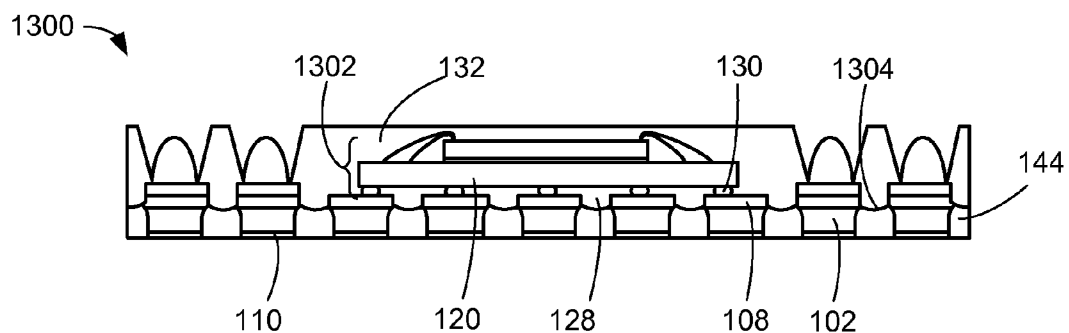
FIG. 13 is a cross-sectional view of an integrated circuit packaging system as exemplified by the isometric view along line 1-1 of FIG. 2 in a fifth embodiment of the present invention.

Referring now to FIG. 13, therein is shown a cross-sectional view of an integrated circuit packaging system 1300 as exemplified by the isometric view along line 1-1 of FIG. 2 in a fifth embodiment of the present invention.

The integrated circuit packaging system 1300 in the fifth embodiment of the present invention can be substantially similar to the integrated circuit packaging system 100 in the first embodiment of the present invention except that the integrated circuit 120 is replaced with an integrated circuit stack 1302. The integrated circuit stack 1302 is defined as two or more integrated circuits attached to one another. The integrated circuit stack 1302 can include the integrated circuit 120. The integrated circuit stack 1302 can be attached to the routable trace 108 via the attachment layer 128. The attachment layer 128 can be, for example, an adhesive or an underfill. The integrated circuit stack 1302 can be electrically connected to the routable trace 108 via the die interconnect 130. The die interconnect 130 can be, for example, wire bonds or solder balls.

The encapsulation 132 can be in direct contact with the protective coat 144. A surface of the external plate 110 can be co-planar with the bottom coat side 146 of the protective coat 146.

A protrusion 1304 of the encapsulation 132 can extend partially into the protective coat 144. The protrusion 1304 can be formed by half-etching the top leadframe side 306 of FIG. 3 of the leadframe 302 of FIG. 3 prior to forming the encapsulation 132. The half-etching of the leadframe 302 can range from five to ten microns.

It has been discovered that forming the protrusion 1304 of the encapsulation 132 extending into the protective coat 144 secures the protective coat 144 and eases out the isolation of individual instance of the lead 102 and the routable trace 108 for solder bump. The protrusion 1304 provides lateral locking with the protective coat 144 and thereby secures the protective coat 144. The half-etching of the leadframe 302 prior to encapsulation decreases the amount of metal needed to be etched to isolate the lead 102 and hence eases out the isolation of the lead 102.

Figure 14:
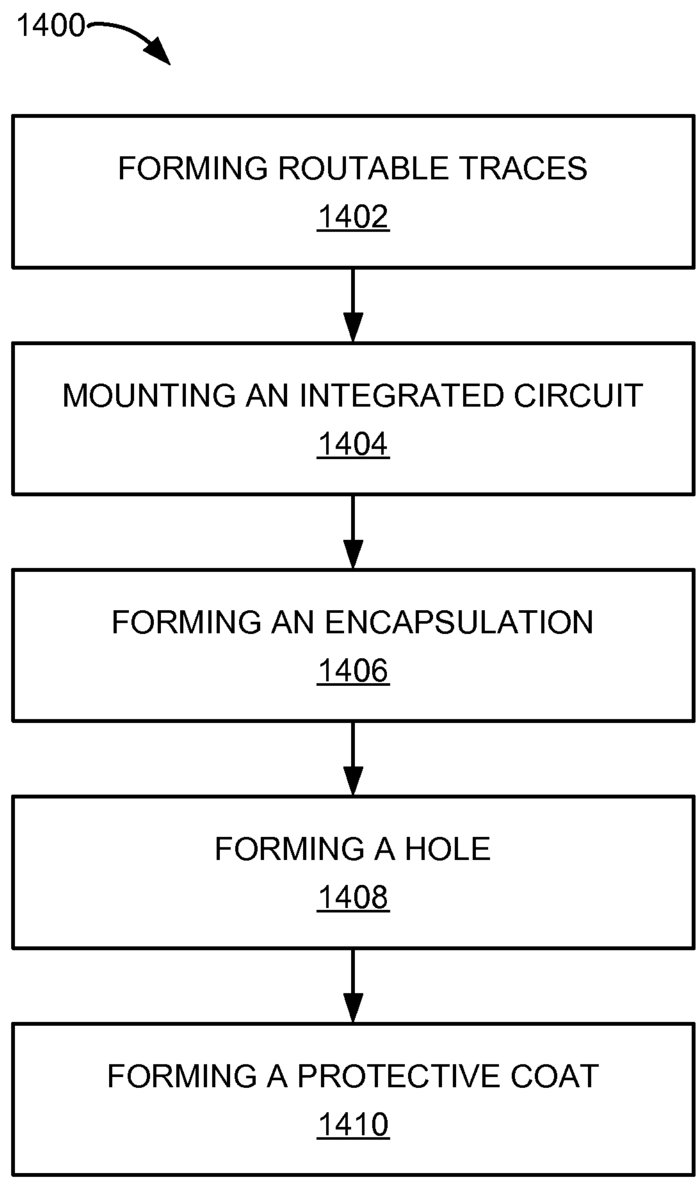
FIG. 14 is a flow chart of a method of manufacture of an integrated circuit packaging system in a further embodiment of the present invention.

Referring now to FIG. 14, therein is shown a flow chart of a method 1400 of manufacture of an integrated circuit packaging system in a further embodiment of the present invention. The method 1400 includes: providing routable traces including a first routable trace with a top plate and a second routable trace, in a block 1402; mounting an integrated circuit partially over a second routable trace, in a block 1404; forming an encapsulation over and around the first routable trace and the integrated circuit, in a block 1406; forming a hole through the encapsulation to the top plate, in a block 1408; and forming a protective coat directly on the encapsulation with the first routable trace between and in contact with the protective coat and the encapsulation, in a block 1410.

Thus, it has been discovered that the integrated circuit packaging system of the present invention furnishes important and heretofore unknown and unavailable solutions, capabilities, and functional aspects for an integrated circuit packaging system with connection. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   forming a lead having a top lead side opposite a bottom lead side;
   forming routable traces directly on the top lead side, the routable traces having a top plate mounted thereon, and a portion of the routable traces completely covering a side of the top plate facing the routable traces;
   mounting an integrated circuit partially over the routable traces;
   forming an encapsulation over and around the routable traces and the integrated circuit;
   forming a hole through the encapsulation to the top plate; and
   forming a protective coat having a top coat side directly on a side of the routable traces facing opposite of the top plate and the protective coat directly on the encapsulation and a non-horizontal side of the lead.

2. The method as claimed in claim 1 further comprising filling a conductive fill in the hole, the conductive fill having a lower volume than the hole of the encapsulation.

3. The method as claimed in claim 1 wherein forming the routable traces includes:
   providing a leadframe;
   forming the routable traces on the leadframe; and
   forming the lead by removing a portion of the leadframe.

4. The method as claimed in claim 1 further comprising mounting a top package substrate on the encapsulation, the top package substrate electrically connected to the top plate through a conductive fill in the hole.

5. The method as claimed in claim 1 further comprising:
   mounting an external interconnect under the routable traces; and
   wherein:
   forming the protective coat includes forming the protective coat with the external interconnect partially surrounded by the protective coat.

6. A method of manufacture of an integrated circuit packaging system comprising:
   forming routable traces on a leadframe, the routable traces include a top plate mounted thereon with a portion of the routable traces completely covering a side of the top plate facing the routable traces;
   mounting an integrated circuit partially over the routable traces;
   forming an encapsulation over and around the routable traces and the integrated circuit;
   etching the leadframe to electrically isolate a lead having the routable traces directly on a top lead side of the lead and the top lead side opposite a bottom lead side;

forming a hole through the encapsulation to the top plate; and forming a protective coat having a top coat side directly on a side of the routable traces facing opposite of the top plate and the protective coat directly on the encapsulation and a non-horizontal side of the lead.

7. The method as claimed in claim 6 wherein forming the hole includes lasering the encapsulation.

8. The method as claimed in claim 6 further comprising attaching an external board under the routable traces with the external board electrically connected to the routable traces.

9. The method as claimed in claim 6 wherein mounting the integrated circuit includes mounting an integrated circuit stack having the integrated circuit.

10. The method as claimed in claim 6 wherein mounting the integrated circuit includes mounting the integrated circuit with a die interconnect between the integrated circuit and the routable traces, the die interconnect surrounded by an attachment layer.

11. An integrated circuit packaging system comprising:

a lead having a top lead side opposite a bottom lead side;

routable traces directly on the top lead side of the lead, the routable traces having a top plate mounted thereon, and a portion of the routable traces completely covering a side of the top plate facing the routable traces;

an integrated circuit partially over the routable traces;

an encapsulation over and around the routable traces and the integrated circuit, the encapsulation having a hole through the encapsulation to the top plate; and a protective coat having a top coat side directly on a side of the routable traces facing opposite the top plate and the protective coat directly on the encapsulation and a non-horizontal side of the lead.

12. The system as claimed in claim 11 further comprising a conductive fill in the hole, the conductive fill having a lower volume than the hole of the encapsulation.

13. The system as claimed in claim 11 wherein the lead is directly on an external plate.

14. The system as claimed in claim 11 further comprising a top package substrate on the encapsulation, the top package substrate electrically connected to the top plate through a conductive fill in the hole.

15. The system as claimed in claim 11 further comprising an external interconnect mounted under the routable traces and surrounded by the protective coat.

16. The system as claimed in claim 11 further comprising a lead electrically isolated from another of the lead, a portion of the routable traces directly on the lead.

17. The system as claimed in claim 16 wherein the encapsulation in the hole has laser ablation marks.

18. The system as claimed in claim 16 further comprising an external board attached under the routable traces and electrically connected to the routable traces.

19. The system as claimed in claim 16 wherein the integrated circuit is part of an integrated circuit stack.

20. The system as claimed in claim 16 further comprising a die interconnect between the integrated circuit and the routable traces, the die interconnect surrounded by an attachment layer.

* * * * *